(12) United States Patent
Curcio et al.

(10) Patent No.: US 6,790,305 B2
(45) Date of Patent: Sep. 14, 2004

(54) METHOD AND STRUCTURE FOR SMALL PITCH Z-AXIS ELECTRICAL INTERCONNECTIONS

(75) Inventors: Brian E. Curcio, San Diego, CA (US); Frank D. Egitto, Binghamton, NY (US); Robert M. Japp, Vestal, NY (US); Thomas R. Miller, Endwell, NY (US); Manh-Quan T. Nguyen, Endicott, NY (US); Douglas O. Powell, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/266,652

(22) Filed: Oct. 8, 2002

(65) Prior Publication Data

US 2004/0067347 A1 Apr. 8, 2004

(51) Int. Cl.[7] .............................................. B32B 31/14
(52) U.S. Cl. ...................... 156/247; 29/852; 438/667; 438/976
(58) Field of Search ................................ 156/247, 249; 29/830, 852; 174/258, 259; 428/209; 438/618, 637, 667, 940, 976

(56) References Cited

U.S. PATENT DOCUMENTS

| | | | |
|---|---|---|---|
| 5,745,984 A | 5/1998 | Cole, Jr. et al. | 29/834 |
| 6,163,957 A | 12/2000 | Jiang et al. | 29/852 |
| 6,245,696 B1 | 6/2001 | Haas et al. | 442/348 |
| 6,319,811 B1 * | 11/2001 | Zimmerman et al. | 438/618 |
| 6,486,394 B1 * | 11/2002 | Schmidt et al. | 174/36 |
| 2002/0023777 A1 | 2/2002 | Ochi et al. | 174/256 |

* cited by examiner

Primary Examiner—Jeff H. Aftergut
Assistant Examiner—John T. Haran
(74) Attorney, Agent, or Firm—Scully, Scott, Murphy & Presser; William H. Steinberg

(57) ABSTRACT

A method for producing small pitch z-axis electrical interconnections in layers of dielectric materials which are applied to printed wiring boards and diverse electronic packages. A method for parallel fabrication of intermediate structures which are subsequently jointed to form a final structure. In addition there is provided a z-interconnected electrical structure, employing dielectric materials such as resin coated copper, employable in the manufacture of diverse type of electronic packages, including printed wiring boards (PWBs), substrates, multi-chip modules and the like.

9 Claims, 7 Drawing Sheets

METHOD AND STRUCTURE FOR SMALL PITCH Z-AXIS ELECTRICAL INTERCONNECTIONS

BACKGROUND OF THE INVENTION

1. Field of the Invention

The present invention relates to a method for producing small pitch z-axis electrical interconnections in layers of dielectric materials which are applied to printed wiring boards and diverse electronic packages. Moreover, pursuant to the invention, there is provided a z-interconnected dielectric layer structure produced by the method as described herein, employing dielectric materials, such as resin coated copper, of the type supplied by Isola Laminates as "RCC" or a polymer coated copper such as supplied by Asahi, employable in the manufacture of diverse type of electronic packages, including printed wiring boards (PWBs), substrates, multi-chip modules and the like.

Currently, in the industry which is concerned with the manufacture of electronic packages, such as those including printed wiring boards, resin coated copper materials are employed in the processing of built-up dielectric layers which may provide for z-interconnections upon lamination and the provision of vias therein. Generally, the resin coated copper material is applied to the printed wiring board, thereafter fully cured, vias are then formed, plating is implemented as required and then circuitized, and is well known in the technology. However, the materials which are employed, such as the resin coated copper; in effect, a filled polyphenylene ether (PPE) coated copper, such as sold by Asahi as APPE, is subject to a deficiency which resides in that in its uncured state the material cannot be wet processed or, alternatively, is incapable of being fully cured and bonded.

2. Discussion of the Prior Art

Although various publications are currently disclosed in the technology, and which are intended to form generally small pitch z-interconnections, none of these are applicable to the present invention.

Cole, Jr. et al. U.S. Pat. No. 5,745,984 discloses a method for producing an electronic module which incorporates a high density interconnect structure employing a KAPTON® layer as a redistribution layer. This has nothing in common with the present invention and it does not employ a resin coated copper material (RCC) analogous to that provided herein in forming the small pitch z-interconnections.

Jiang, et al. U.S. Pat. No. 6,163,957 discloses a multi-layered substrate with high density interconnects and methods of making the same, wherein circuitized pads are employed for the interconnect area. In lieu of having through vias or blind vias, a via is drilled through a substrate to a pad on the other side thereof, terminating on a pad at a first surface of a first circuit layer. This is completely different from the present invention and has nothing in common therewith.

Haas et al. U.S. Pat. No. 6,245,696 B1 discloses a lasable bond-ply material which is employed in the construction of multi-layer wiring boards. The material is B-staged, and various embodiments as disclosed therein provide for a laser drilling of vias and filling thereof with a conductive ink, and then forming a laminated structure. Although, in general, this is somewhat similar to the present invention, unlike this publication the present invention disclosure employs a resin-coated copper (RCC), whereas in contrast therewith, the patent discloses a mixture of a micro-fiberglass and fibers forming a different prepreg material which is intended to be laminated. Consequently, both as to method and structure, the Haas et al. patent is completely different from the present invention as disclosed and claimed herein.

Finally, Ochi, et al. Patent Appln. Publication No. US 2002/0023777A1 employ a base member which is constituted of two materials, whereas contrastingly, the present invention utilizes a single material of greater simplicity and economical nature.

SUMMARY OF THE INVENTION

It is contemplated that for future products of this type which are employed in the manufacture of printed wiring boards, particularly for small pitch grid structures including z-interconnections, it may be necessary to provide dielectric materials without the glass fibers which are contained therein, as is currently usual in the technology. One dielectric material of that type is resin coated copper (RCC), such as is sold under the trademark Asahi PC-5103; in effect, a filled APPE (allylated polyphenylene ether) coated copper material. Moreover, it is also desirable to be able to laminate this resin coated copper material to substrates without the need of having to introduce additional layers for joining these layers together, such as sticker sheets or adhesives, in order to be able to maintain the produced electronic package in a thinnest possible condition and capable of precise layer and via registration.

In order to obviate or eliminate the limited time and drawbacks which are currently being encountered in this technology, there is provided a method and an arrangement for utilizing this material; in essence a resin coated copper, whereby the resin coated copper material is transferred to a base substrate which may be constituted of either a copper plane or thin multilayer panel, and processed in a lamination press under an essentially low pressure and temperature. This physical condition would thus be adequate to join the material to the base layer without advancing the cure stage of the material, and with the joint being adequate to facilitate the peeling of the copper carrier from the resin coated copper material without lifting of the material.

Pursuant to the inventive method it is also possible to peel the carrier from the resin coated copper layer after drilling, however, the small web remaining between any vias in the material could potentially tear and shred the copper carrier, rendering it difficult to fully remove the latter from the resin coated copper layer without damage.

Subsequent to peeling the copper carrier from the resin coated copper material, it is possible to apply a new protective surface carrier, comprising materials such as Mylar, polyester, or polyvinylidene fluoride, saran wrap or the like, by way of example, to the surface of the resin coated copper material so as to thereby provide a protective layer. This will enable the resin coated copper surface to be laser drilled to form vias at a lower energy inasmuch as it is not necessary to have to drill through copper. Moreover, this would offer protection from redeposited debris encountered as a result of drilling, while also potentially serving as a barrier surface during hole fill of the vias. This protective surface layer can then be peeled off, and a laminate structure formed by the underlying resin coated copper surface and substrates is capable of being produced in a separate parallel relationship and then laminated together as constituents of the printed wiring board (PWB).

Accordingly, it is an object of the present invention to provide a novel method for producing small pitch z-interconnections for printed wiring board structures, employing a resin coated copper material which is transferred onto a base carrier layer in a lamination press at a low pressure and temperature and facilitating the material being joined to the carrier layer without advancing the cure of the resin coated copper material, and enabling readily peeling the base carrier layer from the resin coated copper material.

Another object of the present invention resides in providing a method as described herein wherein the resin coated copper material is transferred to a base carrier, constituted of either of a copper plane or thin multilayer panel, adhered thereto in a lamination press under low temperature and pressure which enables peeling the carrier layer therefrom after drilling of vias, and facilitating the application of a new protective surface carrier to the resin coated copper material.

Yet another object of the present invention resides in the provision of an arrangement for forming small pitch z-axis interconnections for a printed wiring board utilizing a resin coated copper material which is transferred onto a base carrier in a lamination press under low pressure and temperature conditions on the absence of advancing the cure of the resin coated copper material.

A more specific object resides in the provision of an arrangement of the type described herein which enables the joining of the resin coated copper material to a base substrate, comprising either a copper plane or thin multilayer panel without advancing the cure of the resin coated copper material and which is adapted to facilitate peeling the base substrate from the resin coated copper material without lifting the material.

Yet another object is to provide an arrangement as described herein wherein the substrate or base carrier layer can be peeled away from the resin coated copper material subsequent to drilling vias, and facilitating the application of a new protective surface carrier to the resin coated copper material so as to supply a protective layer facilitating laser drilling at a lower energy.

Pursuant to the present invention the arrangement enables an underlying resin coated copper material surface below the protective surface layer to be formed separately in parallel with substrates and thereafter laminated together, as required.

BRIEF DESCRIPTION OF THE ACCOMPANYING DRAWINGS

Reference may now be made to the following detailed description of preferred embodiments of the invention, taken in conjunction with the accompanying drawings; in which.

DETAILED DESCRIPTION OF PREFERRED EMBODIMENTS

Figure 1A:
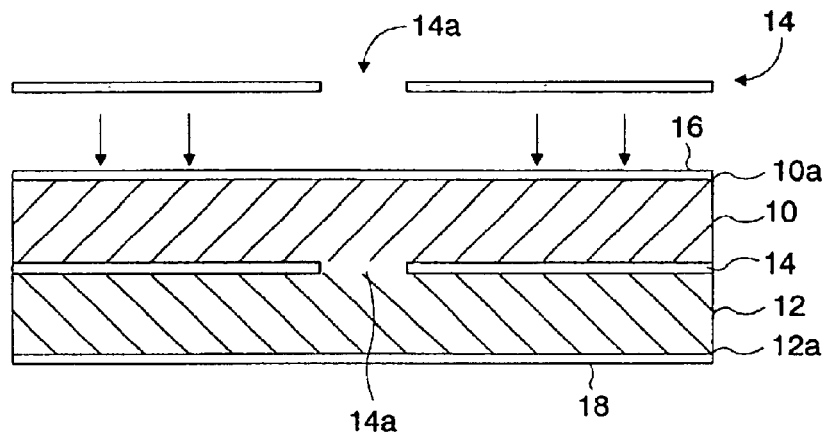
FIGS. 1A through 1D illustrate, respectively, successive method steps in forming a first embodiment of a laminate employing the resin coated copper material.

Referring now in detail to the embodiment of FIGS. 1A through 1D; there is diagrammatically illustrated the formation of a laminate, wherein resin coated copper material layers 10, 12 are laminated under low pressure and temperature conditions so as to limit the advance in cure. A copper foil 14 is first personalized so as to create openings 14a, referred to as clearance areas or anti-pads, through which vias will be formed in a subsequent formication step. Resin coated copper material layer 10, 12 are laminated on either side of copper foil 14 having outer surface 16, 18 to create the structure in FIG. 1A. Surfaces 10a, 12a represent the interfacial surface between 16, 18 and 10, 12.

Figure 1B:
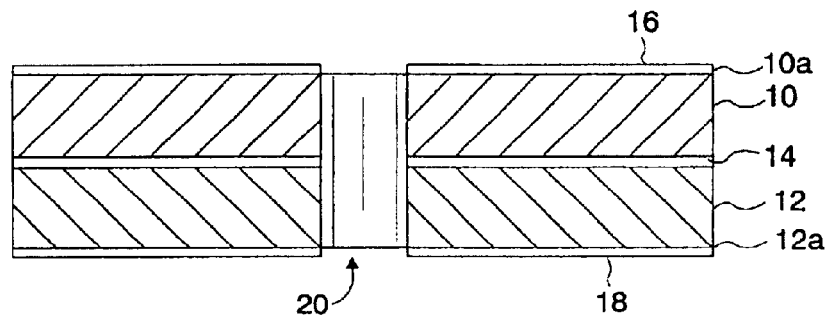
Figure 1C:
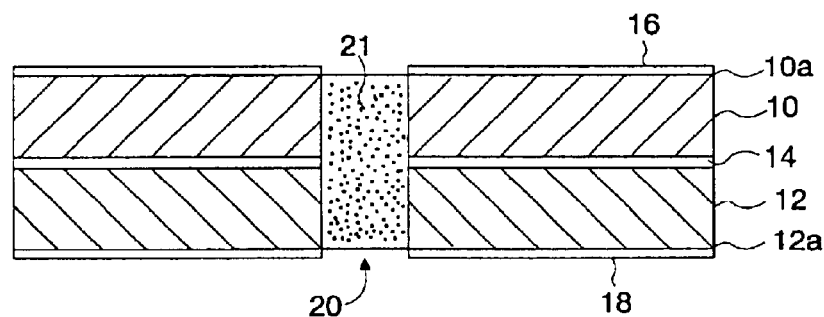
Figure 1D:
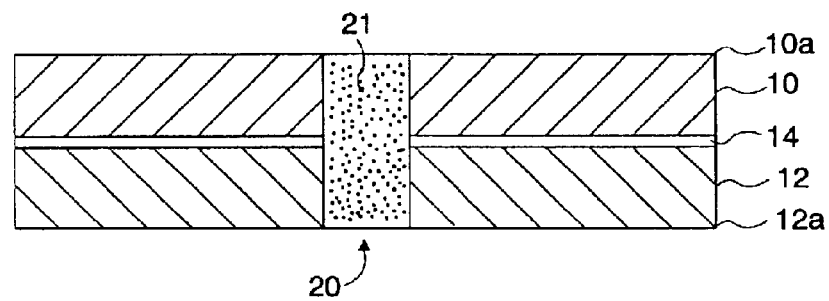

Thereafter, as shown in FIG. 1B, one or more vias 20 (as required) are formed by laser drilling or other suitable means as known in the technology, so as to extend through the laminated resin coated copper material layers 10, 12 and foil 14. In FIG. 1C, the via or vias 20 are shown as being filled with a conductive paste 21. The via or vias 20 may extend through the entire structure, or alternatively may be blind holes extending only partially into the structure from one or both sides of copper foil 14. Subsequently, as shown in FIG. 1D, the copper layers 16,18 are peeled off outer surfaces 10a and 12a, without effecting any etching so as to produce a relaminatable surface on the exterior of the resin material layers 10, 12 to form z-axis interconnects on the substrate of a printed wiring board (PWB) or the like (not shown). Although the via or vias 20 are shown as intersecting the internal copper foil 14, this is an opetional aspect since the via may not extend therethrough depending upon whether the via (or vias) act as a conductor (or conductors) from one side to the other or from one side to the middle plane of the structure.

Figure 2A:
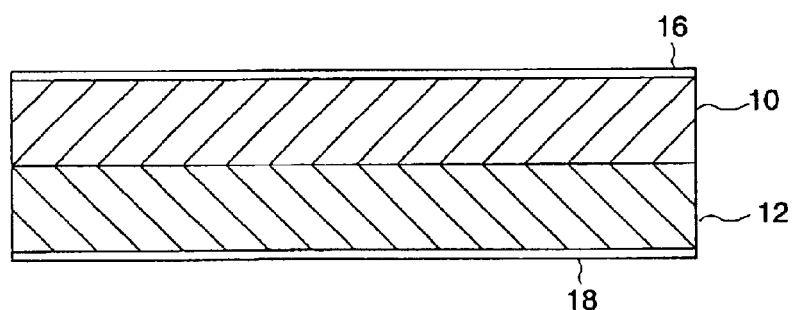
FIGS. 2A through 2F illustrate, respectively, successive method steps in forming of a laminated structure for a printed wiring board employing the resin coated copper material.
Figure 2B:
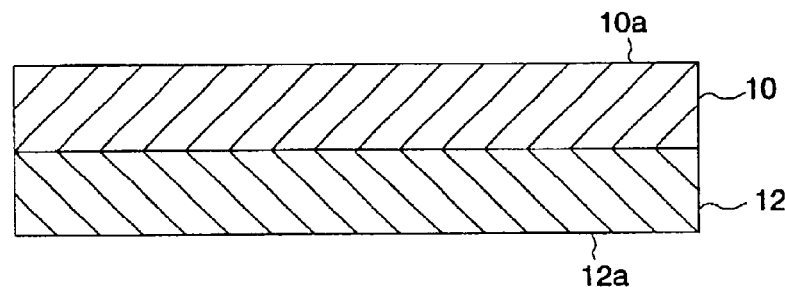
Figure 2C:
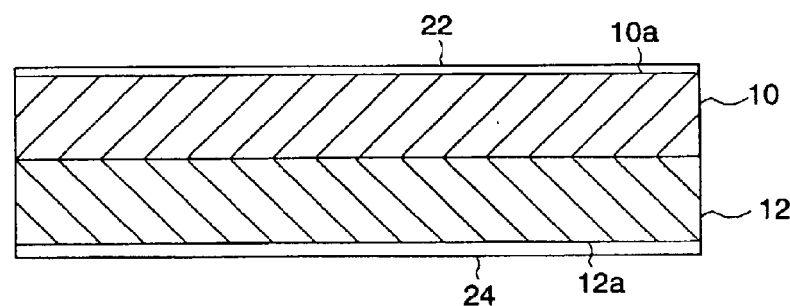
Figure 2D:
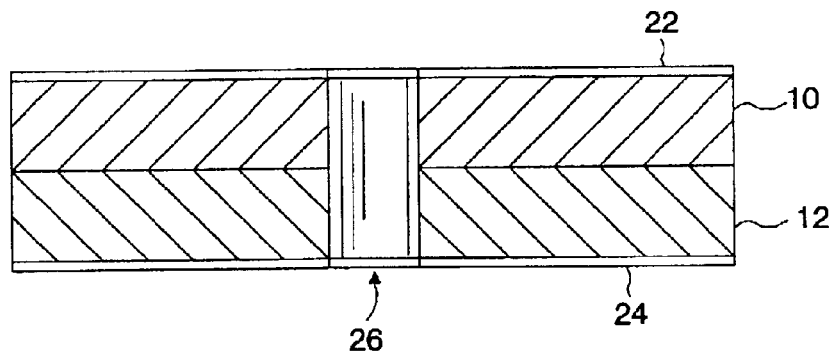

As illustrated in the embodiment of FIGS. 2A through 2F of the drawings, in which like references are used as in FIGS. 1A through 1D, the resin coated copper material layers 10, 12 have copper foil 16,18 applied to each of the opposite outer surfaces 10a, 12a of layers 10, 12. This is implemented at a suitably low temperature and pressure so as to limit the advancing cure of the resin coated copper material 10, 12. Thereafter the copper foil layers copper foil outer surfaces 16, 18 are peeled off from each surface 10a, 12a, as shown in FIG. 2B, and protective material layers 22, 24 are applied to the outer surfaces 10a, 12a of the resin material layers 10, 12. This protective material can be constituted of Mylar, polyester, polyvinylidene fluoride, even Saran wrap (Reg.™) or the like, and enables one or more vias 26 to be drilled through the laminate as shown in FIG. 2D of the drawings. Since there is no drilling implemented through any copper foil layer, the protective layers 22, 24 offer protection to the resin material from redeposited debris, and can also serve as a barrier surface during filling of the vias. Moreover, the absence of the previously peeled off copper foil layers 16,18 facilitates the drilling of the vias 26 at a lower energy level.

Figure 2E:
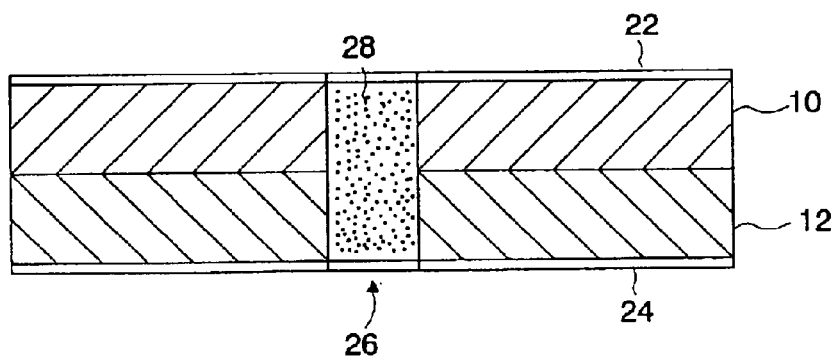
Figure 2F:
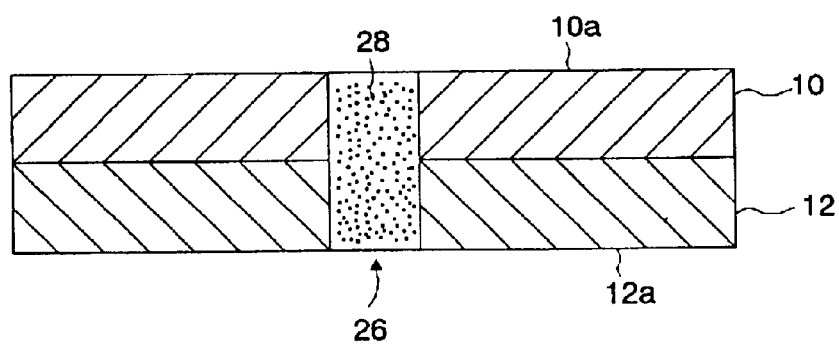

Thereafter, a via or vias 26 having been filled with either a conductive or non-conductive paste 28, as shown in FIG. 2E, the protective layers 22, 24 are removed or peeled off from the exterior surfaces 10a, 12a of the resin material 10,12 as shown in FIG. 2F, so as to produce relaminatable surfaces for lamination to diverse substrates (not shown) and provide the z-axis interconnections.

It is also contemplatable to provide a structure employing at least one resin coated copper layer without the interposition of an internal copper foil 14, which for the remainder is analogous to the above-described construction.

The foregoing method enables the fabrication of laminates and, more particularly, facilitates and the production of small pitch z-axis interconnected laminates of less than 250 micron pitch, and can also be employed to fabricate large panel multilayer printed wiring boards.

Figure 3A:
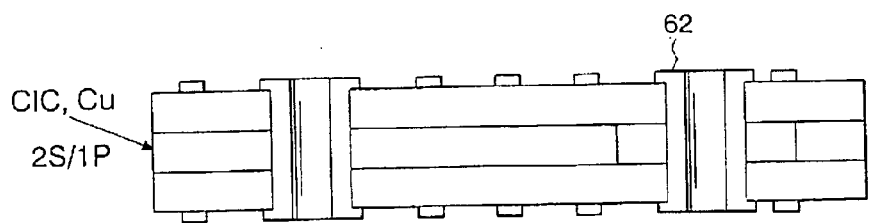
FIGS. 3A through 3I illustrate sequential method steps in producing alternative small pitch z-axis interconnection with paste-filled vias or PHTs and an integral joined dielectric material.
Figure 3B:
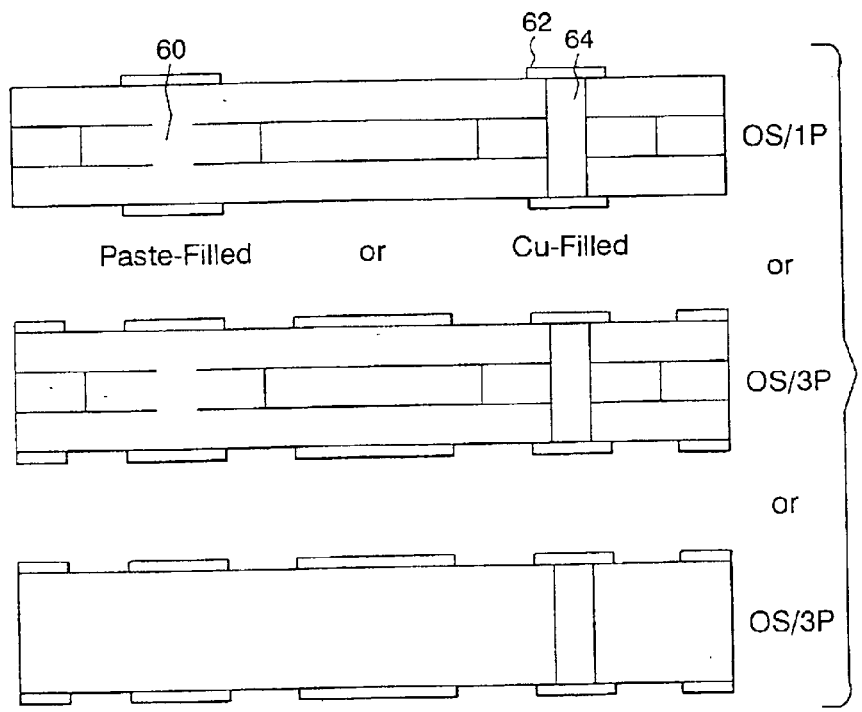
Figure 3C:
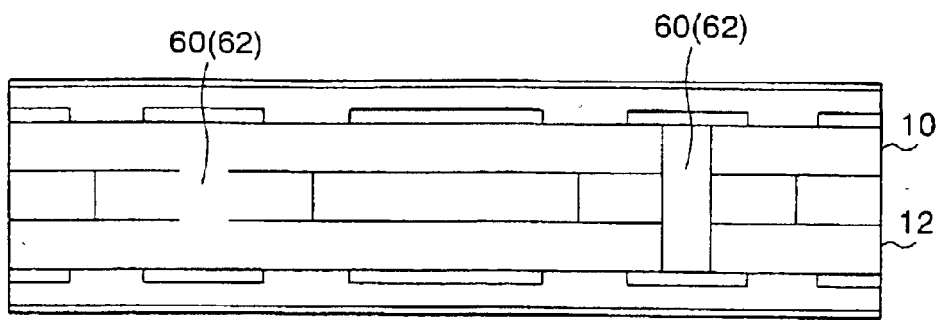
Figure 3D:
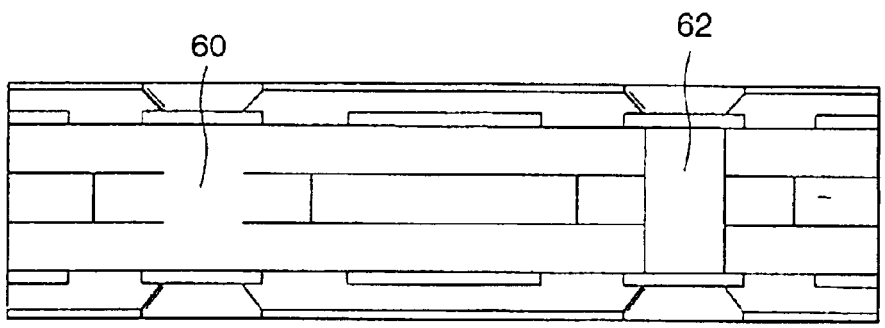
Figure 3E:
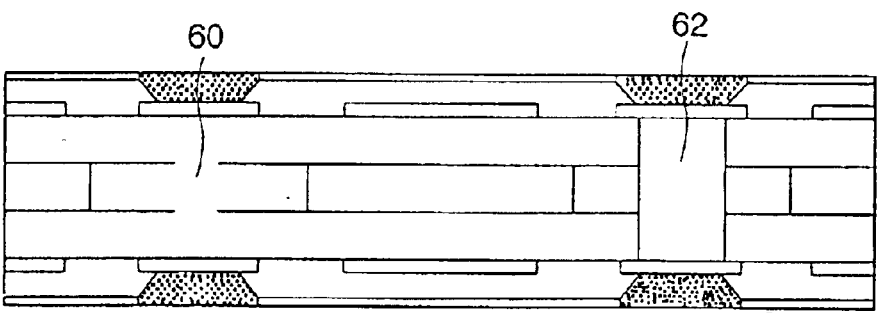
Figure 3F:
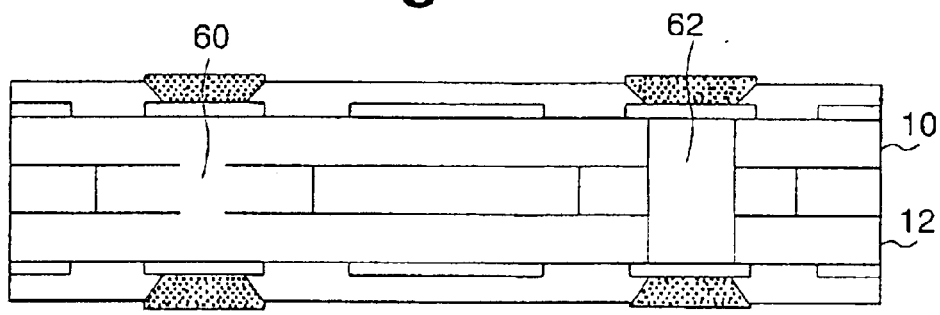
Figure 3G:
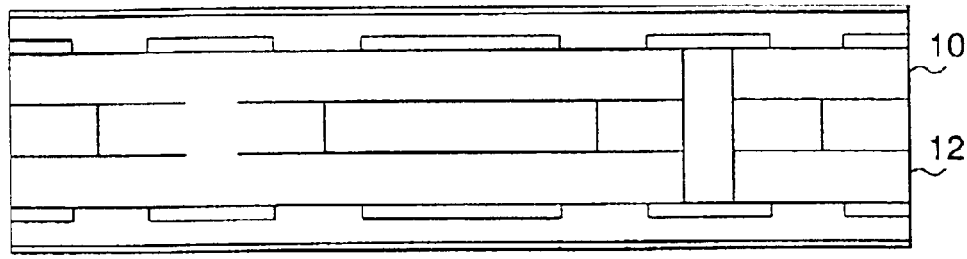
Figure 3H:
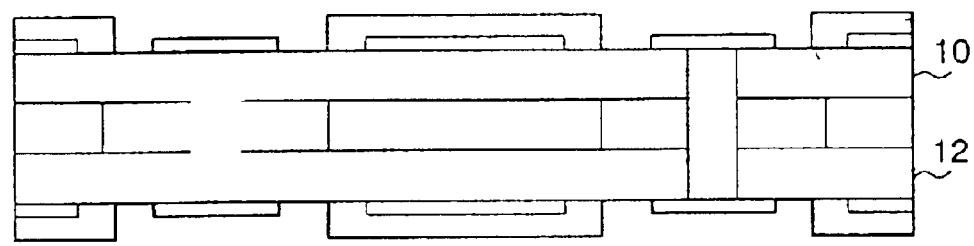

Reference may now be made to FIGS. 3A through 3I, as shown in FIG. 3A, wherein plated through holes (PTH) 60 may comprise vias in the resin coated copper laminate 62, whereas in FIG. 3B, vias 64 are provided in the laminate 62, which are full of conductive paste which forms electrical connections during lamination. Pursuant to another concept the vias can be filled, and conductive fill material is then dried or B-stage cured at a temperature lower than is needed to complete the resin coated copper material cure. Subsequently, the materials are aligned and joined.

Pursuant to another concept, the base laminate vias can be filled with a cured paste which may be conductive or non-conductive, this providing a planar surface, as well as adding to the plated through hole (PTH) reliability or reducing the amount of copper required in the base laminate, as illustrated in FIGS. 3C through 3F. The resin coated copper method of application is utilized as described hereinabove over the base and vias are opened with the aid of a laser. Conductive paste for joining may be then dispensed into the opening or vias essentially as described in FIGS. 1A to 1D and 2A through 2F as detailed hereinabove. It is also possible to produce other embodiments, such as those having through vias, blind vias, or both found in the resin coated copper laminate material.

Figure 3I:
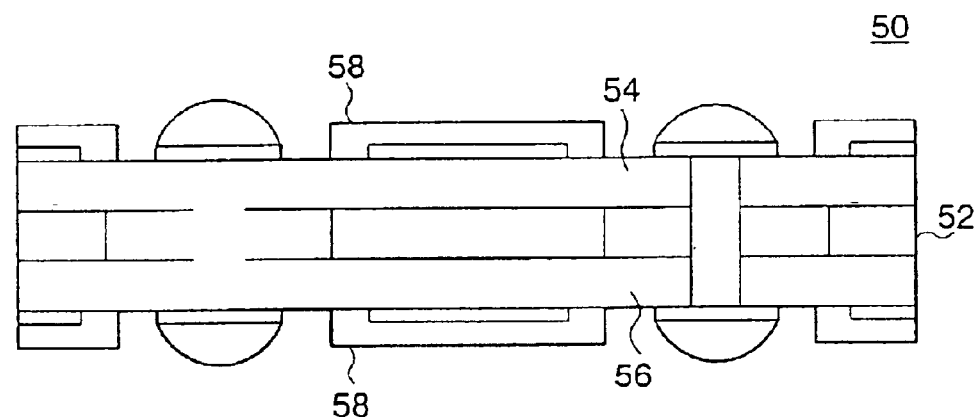

Referring in particular to FIG. 3I, there is shown a completed multilayer laminate 50 showing the copper layer center 52 with resin coated copper external layers 54, 56 and circuitized outer surfaces 58 provided thereon. Plated through-holes (PTH) or paste filled vias 60 (62) are provided therein.

As shown in FIGS. 3C to 3F, there are different method steps provided, showing the laminate with paste-filled vias 60 or copper filled vias 62, with external layers consisting of resin coated copper material 70,72.

Figure 4:
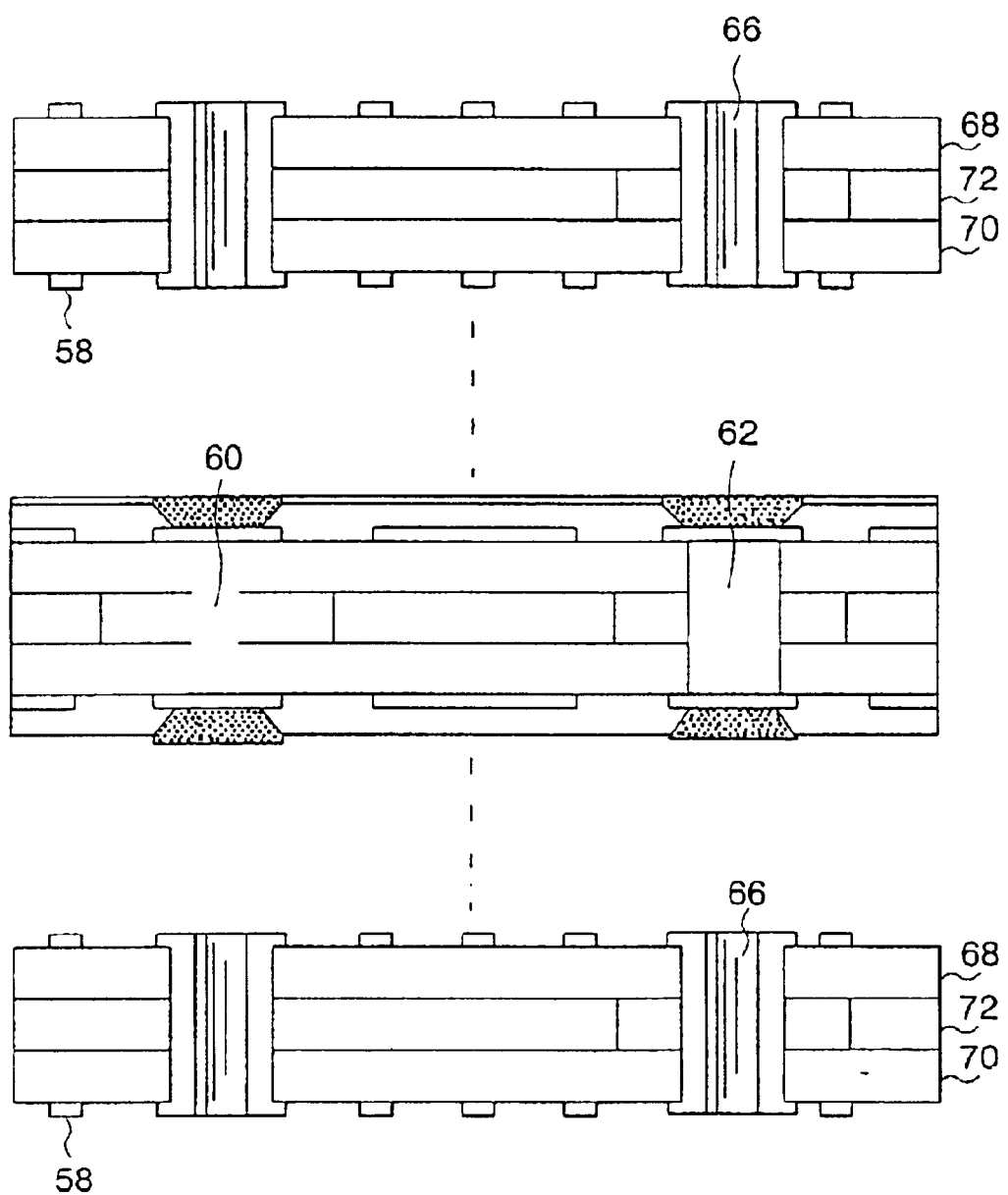
FIG. 4 illustrates a z-interconnection with paste-filled vias and integral joined dielectric material in order to produce a laminate pursuant to the invention.

This foregoing is also indicated in FIG. 4, showing a z-axis interconnect with conductive paste 60 (62); and an integral dielectric laminate shown with a first portion. Plated through holes (PTHs) 66 are shown extending between the external layers 68, 70 of resin coated copper material, with a center layer being laminated therebetween. The layers may be laminated so as to form a z-axis interconnection with the conductive paste and aligned integrally adjoining dielectric layers.

From the foregoing it becomes readily apparent that the present invention provides for a novel method and arrangement forming z-axis interconnections for small pitch applications employed in the manufacture of printed wiring boards (PWBs).

While the invention has been particularly shown and described with respect to preferred embodiments thereof, it will be understood by those skilled in the art that the foregoing and other changes in form and details may be made therein without departing from the spirit and scope of the invention.

What is claimed is:

1. A method for producing small pitch z-axis interconnections in built-up layers of dielectric materials for electronic packages; comprising the steps of:
    providing at least two superimposed layers of said dielectric materials;
    applying a protective layer comprising a copper foil to respectively each of the external surfaces of said superimposed dielectric material layers;
    partially curing said dielectric material layers so as to bond said dielectric layers to each other;
    removing said protective copper foil layers from the external surfaces of said dielectric material layers;
    applying further protective layers selected from the group of materials consisting of polyester and polyvinylidene fluoride, to the external surfaces of said partially cured dielectric material layers;
    forming at least one via in said superimposed dielectric material and in said further protective layers; and
    removing said further protective layers from the surfaces of said dielectric material layers to provide relaminatable surfaces on said dielectric material layers facilitating lamination to diverse substrates.

2. A method as claimed in claim 1, wherein said protective copper foil layers are peeled from said external surfaces of said dielectric material layers in the absence of effectuating any etching.

3. A method as claimed in claim 1, wherein said protective copper foil layers are applied to said external surfaces of said dielectric material layers under low temperatures and pressures so as to inhibit advancing the curing of said dielectric material layers.

4. A method as claimed in claim 1, wherein said dielectric material layers are each constituted of resin coated copper.

5. A method as claimed in claim 1, wherein said dielectric material layers are each constituted of polymer coated copper.

6. A method as claimed in claim 1, wherein said at least one via is filled with an electrically conductive material.

7. A method as claimed in claim 6, wherein said electrically conductive material consists of a paste.

8. A method as claimed in claim 1, wherein said at least one via is filled with an electrically non-conductive material.

9. A method as claimed in claim 1, wherein said dielectric material layers comprise components of a printed wiring board (PWB).

* * * * *